United States Patent
Zhu et al.

(10) Patent No.: US 11,468,706 B2
(45) Date of Patent: Oct. 11, 2022

(54) FINGERPRINT IDENTIFICATION METHOD, FINGERPRINT IDENTIFICATION STRUCTURE AND DISPLAY DEVICE

(71) Applicant: BOE TECHNOLOGY GROUP CO., LTD., Beijing (CN)

(72) Inventors: Wenxiu Zhu, Beijing (CN); Bo Wang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/236,926

(22) Filed: Apr. 21, 2021

(65) Prior Publication Data

US 2022/0075985 A1    Mar. 10, 2022

(30) Foreign Application Priority Data

Sep. 7, 2020   (CN) .......................... 202010928343.X

(51) Int. Cl.
*G06V 40/12*    (2022.01)
*G06V 40/13*    (2022.01)
*H01L 27/32*    (2006.01)

(52) U.S. Cl.
CPC ...... *G06V 40/1365* (2022.01); *G06V 40/1318* (2022.01); *G06V 40/1335* (2022.01); *H01L 27/323* (2013.01); *H01L 27/3227* (2013.01); *H01L 27/3234* (2013.01)

(58) Field of Classification Search
CPC .......... G06V 40/1365; G06V 40/1318; G06V 40/1335; H01L 27/3227; H01L 27/323; H01L 27/3234
See application file for complete search history.

(56) References Cited

U.S. PATENT DOCUMENTS

2021/0064837 A1*  3/2021  Zeng ..................... G09G 3/3225
2021/0110131 A1*  4/2021  Lin ................... H01L 27/14623

* cited by examiner

*Primary Examiner* — Premal R Patel
(74) *Attorney, Agent, or Firm* — McCoy Russell LLP

(57) ABSTRACT

A display device includes a cover plate, an OLED display substrate and a photosensitive sensor. A color filter layer is arranged between the cover plate and the OLED display substrate and includes a light-shielding region arranged between adjacent color resistance layers. A plurality of imaging pinholes is formed in the light-shielding region and a first distance between the cover plate and each imaging pinhole is smaller than a second distance between the photosensitive sensor and the imaging pinhole. A fingerprint identification method for the display device includes: dividing the plurality of imaging pinholes into at least two groups of imaging pinholes; imaging the fingerprint via the at least two groups of imaging pinholes sequentially in accordance with a predetermined time sequence, to acquire at least two first fingerprint images; and combining the at least two first fingerprint images to acquire a complete fingerprint image.

14 Claims, 4 Drawing Sheets

# FINGERPRINT IDENTIFICATION METHOD, FINGERPRINT IDENTIFICATION STRUCTURE AND DISPLAY DEVICE

CROSS-REFERENCE TO RELATED APPLICATION

This application claims a priority of the Chinese patent application No. 202010928343.X filed on Sep. 7, 2020, which is incorporated herein by reference in its entirety.

TECHNICAL FIELD

The present disclosure relates to the manufacture of a display product, in particular to a fingerprint identification method, a fingerprint identification structure and a display device.

BACKGROUND

Fingerprint, as an invariant feature of a human being, is inborn, unique and capable of being distinguished from the others. The fingerprint consists of ridges and valleys on a skin surface at a fingertip, and uniqueness of the fingerprint depends on details of a combination of the ridges and valleys. A display panel with a fingerprint identification function has already been applied for personal identification verification, so as to improve information security of a display device.

SUMMARY

In a first aspect, the present disclosure provides in some embodiments a fingerprint identification method for a display device. The display device includes a cover plate, an Organic Light-Emitting Diode (OLED) display substrate, and a photosensitive sensor arranged at a side of the OLED display substrate away from the cover plate. A color filter layer is arranged between the cover plate and the OLED display substrate and includes a light-shielding region arranged between adjacent color resistance layers. A plurality of imaging pinholes is formed in the light-shielding region, and each imaging pinhole is configured to image a fingerprint in contact with the cover plate onto the photosensitive sensor. The OLED display substrate includes a plurality of light-emitting elements arranged in an array form, and a first distance between the cover plate and the imaging pinhole is smaller than a second distance between the photosensitive sensor and the imaging pinhole. The fingerprint identification method includes: dividing the plurality of imaging pinholes into at least two groups of imaging pinholes, imaging regions on the photosensitive sensor corresponding to any two imaging pinholes in each group being located at different regions on a same plane; imaging the fingerprint via the at least two groups of imaging pinholes sequentially in accordance with a predetermined time sequence, to acquire at least two first fingerprint images; and combining the at least two first fingerprint images to acquire a complete fingerprint image.

In a possible embodiment of the present disclosure, the plurality of imaging pinholes is arranged in an array form.

In a possible embodiment of the present disclosure, the second distance is smaller than or equal to 1.414 times of the first distance.

In a possible embodiment of the present disclosure, the dividing the plurality of imaging pinholes into the at least two groups of imaging pinholes includes dividing the plurality of imaging pinholes into a first group of imaging pinholes and a second group of imaging pinholes. The first group of imaging pinholes include a plurality of imaging pinholes in odd-numbered rows and odd-numbered columns and a plurality of imaging pinholes in even-numbered rows and even-numbered columns, and the second group of imaging pinholes include a plurality of imaging pinholes in the odd-numbered rows and the even-numbered columns and a plurality of imaging pinholes in the even-numbered rows and the odd-numbered columns.

In a possible embodiment of the present disclosure, the imaging the fingerprint via the at least two groups of imaging pinholes sequentially in accordance with the predetermined time sequence to acquire the at least two first fingerprint images includes: controlling a plurality of light-emitting elements corresponding to the first group of imaging pinholes to emit light, controlling a plurality of light-emitting elements corresponding to the second group of imaging pinholes not to emit light, and forming a first fingerprint sub-image via the imaging pinholes in the first group of imaging pinholes; and controlling the plurality of light-emitting elements corresponding to the first group of imaging pinholes to be deenergized, controlling the plurality of light-emitting elements corresponding to the second group of imaging pinholes to emit light, and forming a second fingerprint sub-image via the imaging pinholes in the second group of imaging pinholes. The combining the at least two first fingerprint images to acquire the complete fingerprint image includes combining the first fingerprint sub-image and the second fingerprint sub-image to acquire the complete fingerprint image.

In a possible embodiments of the present disclosure, the imaging the fingerprint via the at least two groups of imaging pinholes sequentially in accordance with the predetermined time sequence to acquire the at least two first fingerprint images includes: controlling a plurality of light-emitting elements corresponding to the second group of imaging pinholes to emit light, controlling a plurality of light-emitting elements corresponding to the first group of imaging pinholes not to emit light, and forming a third fingerprint sub-image via the imaging pinholes in the second group of imaging pinholes; and controlling the plurality of light-emitting elements corresponding to the second group of imaging pinholes to be deenergized, controlling the plurality of light-emitting elements corresponding to the first group of imaging pinholes to emit light, and forming a fourth fingerprint sub-image via the imaging pinholes in the first group of imaging pinholes. The combining the at least two first fingerprint images to acquire the complete fingerprint image includes combining the third fingerprint sub-image and the fourth fingerprint sub-image to acquire the complete fingerprint image.

In a possible embodiment of the present disclosure, the second distance is greater than or equal to 1.414 times of the first distance, and smaller than or equal to 2 times of the first distance.

In a possible embodiment of the present disclosure, the dividing the plurality of imaging pinholes into the at least two groups of imaging pinholes includes providing each group of imaging pinholes with at least two imaging pinholes spaced apart from each other.

In a possible embodiment of the present disclosure, the providing each group of imaging pinholes with the at least two imaging pinholes spaced apart from each other includes dividing the plurality of imaging pinholes into a first group of imaging pinholes, a second group of imaging pinholes, a third group of imaging pinholes and a fourth group of imaging pinholes. The first group of imaging pinholes include first imaging pinholes in odd-numbered rows and odd-numbered columns, the second group of imaging pinholes include second imaging pinholes in the odd-numbered rows and even-numbered columns, the third group of imaging pinholes include third imaging pinholes in even-numbered rows and the odd-numbered columns, and the fourth group of imaging pinholes include fourth imaging pinholes in the even-numbered rows and the even-numbered columns.

In a possible embodiment of the present disclosure, the imaging the fingerprint via the at least two groups of imaging pinholes sequentially in accordance with the predetermined time sequence to acquire the at least two first fingerprint images includes: controlling a plurality of light-emitting elements corresponding to the first group of imaging pinholes to emit light, controlling a plurality of light-emitting elements corresponding to the second group of imaging pinholes, the third group of imaging pinholes and the fourth group of imaging pinholes not to emit light, and forming a first fingerprint sub-image via the first imaging pinholes in the first group of imaging pinholes; controlling the plurality of light-emitting elements corresponding to the first group of imaging pinholes to be deenergized, controlling the plurality of light-emitting elements corresponding to the second group of imaging pinholes to emit light, controlling the plurality of light-emitting elements corresponding to the third group of imaging pinholes and the fourth group of imaging pinholes not to emit light, and forming a second fingerprint sub-image via the second imaging pinholes in the second group of imaging pinholes; controlling the plurality of light-emitting elements corresponding to the second group of imaging pinholes to be deenergized, controlling the plurality of light-emitting elements corresponding to the third group of imaging pinholes to emit light, controlling the plurality of light-emitting elements corresponding to the first group of imaging pinholes and the fourth group of imaging pinholes not to emit light, and forming a third fingerprint sub-image via the third imaging pinholes in the third group of imaging pinholes; and controlling the plurality of light-emitting elements corresponding to the third group of imaging pinholes to be deenergized, controlling the plurality of light-emitting elements corresponding to the fourth group of imaging pinholes to emit light, controlling the plurality of light-emitting elements corresponding to the first group of imaging pinholes and the second group of imaging pinholes not to emit light, and forming a fourth fingerprint sub-image via the fourth imaging pinholes in the fourth group of imaging pinholes. The combining the at least two first fingerprint images to acquire the complete fingerprint image includes combining the first fingerprint sub-image, the second fingerprint sub-image, the third fingerprint sub-image and the fourth fingerprint sub-image to acquire the complete fingerprint image.

In a possible embodiment of the present disclosure, the imaging the fingerprint via the at least two groups of imaging pinholes sequentially in accordance with the predetermined time sequence to acquire the at least two first fingerprint images includes: controlling a plurality of light-emitting elements corresponding to the fourth group of imaging pinholes to emit light, controlling a plurality of light-emitting elements corresponding to the first group of imaging pinholes, the second group of imaging pinholes and the third group of imaging pinholes not to emit light, and forming a fourth fingerprint sub-image via the fourth imaging pinholes in the fourth group of imaging pinholes; controlling the plurality of light-emitting elements corresponding to the fourth group of imaging pinholes to be deenergized, controlling the plurality of light-emitting elements corresponding to the third group of imaging pinholes to emit light, controlling the plurality of light-emitting elements corresponding to the first group of imaging pinholes and the second group of imaging pinholes not to emit light, and forming a third fingerprint sub-image via the third imaging pinholes in the third group of imaging pinholes; controlling the plurality of light-emitting elements corresponding to the third group of imaging pinholes to be deenergized, controlling the plurality of light-emitting elements corresponding to the second group of imaging pinholes to emit light, controlling the plurality of light-emitting elements corresponding to the first group of imaging pinholes and the fourth group of imaging pinholes not to emit light, and forming a second fingerprint sub-image via the second imaging pinholes in the second group of imaging pinholes; and controlling the plurality of light-emitting elements corresponding to the second group of imaging pinholes to be deenergized, controlling the plurality of light-emitting elements corresponding to the first group of imaging pinholes to emit light, controlling the plurality of light-emitting elements corresponding to the third group of imaging pinholes and the fourth group of imaging pinholes not to emit light, and forming a first fingerprint sub-image via the first imaging pinholes in the first group of imaging pinholes. The combining the at least two first fingerprint images to acquire the complete fingerprint image includes combining the fourth fingerprint sub-image, the third fingerprint sub-image, the second fingerprint sub-image and the first fingerprint sub-image to acquire the complete fingerprint image.

In a possible embodiment of the present disclosure, the plurality of light-emitting elements corresponds to the plurality of imaging pinholes respectively, an orthogonal projection of each imaging pinhole onto the OLED display substrate is located at a first region of the OLED display substrate, and each light-emitting element includes a plurality of pixels located within a predetermined range surrounding the first region.

In a possible embodiment of the present disclosure, the predetermined range is a range where M*N pixels enclosing the corresponding imaging pinhole are arranged, where M and N are each an integer greater than or equal to 2.

In a second aspect, the present disclosure provides in some embodiments a fingerprint identification structure, including: a base substrate, and a plurality of imaging pinholes formed in the base substrate and divided into at least two groups of imaging pinholes; an OLED display substrate including a plurality of light-emitting elements arranged in an array form and a driving circuitry configured to drive the plurality of light-emitting elements to emit light; a photosensitive sensor arranged at a side of the OLED display substrate away from the base substrate, the driving circuitry being configured to control the plurality of light-emitting elements corresponding to the at least two groups of imaging pinholes to emit light in accordance with a predetermined time sequence, so that a fingerprint is imaged via the at least two groups of imaging pinholes onto the photosensitive sensor in accordance with the predetermined time sequence to acquire at least two first fingerprint images, imaging regions on the photosensitive sensor corresponding to any two imaging pinholes in each group being located at different regions on a same plane; and an image processing circuitry coupled to the photosensitive sensor and configured to combine the at least two first fingerprint images to acquire a complete fingerprint image. A first distance between the base substrate and each imaging pinhole is smaller than a second distance between the photosensitive sensor and the imaging pinhole.

In a third aspect, the present disclosure provides in some embodiments a display device including the above-mentioned fingerprint identification structure. The base substrate is also used as a cover plate, a color filter layer is arranged between the cover plate and the OLED display substrate and includes a light-shielding layer arranged between adjacent color resistance layers, the plurality of imaging pinholes is formed in the light-shielding region, and the imaging pinhole is configured to image a fingerprint in contact with the cover plate onto the photosensitive sensor.

DETAILED DESCRIPTION

Figure 1:
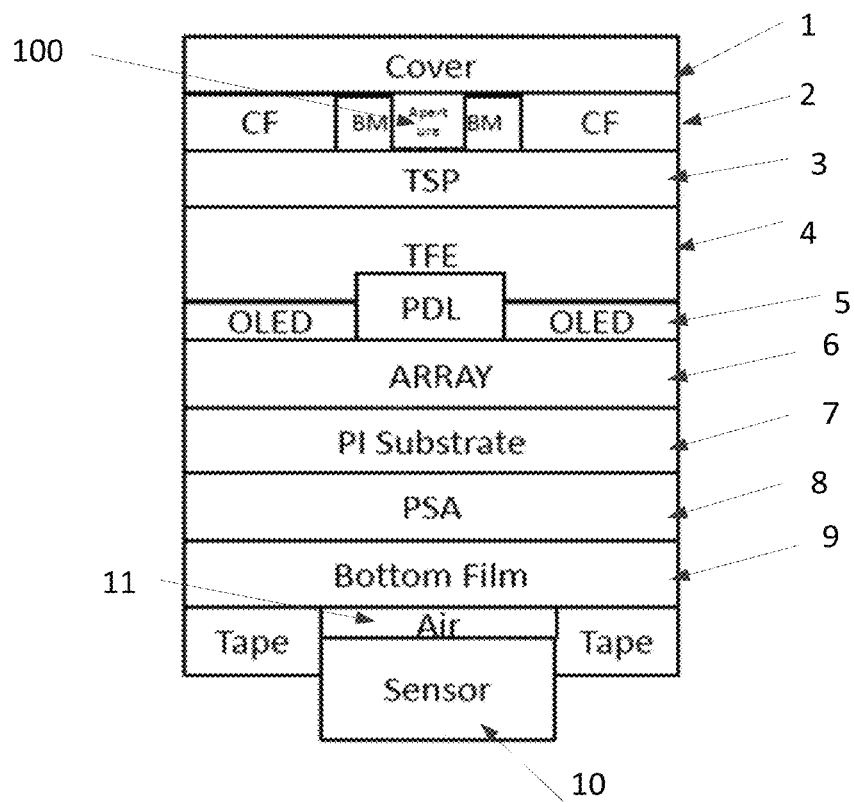
FIG. 1 is a schematic view showing a display device.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be appreciated that, such words as "in the middle of", "on/above", "under/below", "left", "right", "vertical", "horizontal", "inside" and "outside" may be used to indicate directions or positions as viewed in the drawings, and they are merely used to facilitate the description in the present disclosure, rather than to indicate or imply that a device or member must be arranged or operated at a specific position. In addition, such words as "first", "second" and "third" may be merely used to differentiate different components rather than to indicate or imply any importance.

In the related art, based on a pinhole imaging principle, fingerprint identification is achieved by an OLED display panel with a fingerprint identification function by means of an image sensor and pinholes in the OLED display panel. However, for the pinhole imaging, an imaging region may increase along with a decrease in an object distance, so images acquired through two adjacent imaging pinholes may overlap each other. Currently, in order to meet the requirements on a light and thin screen, a thickness of a cover film needs to be as small as possible on the premise that a protection function is achieved. In this regard, the object distance may be smaller than an image distance, and an enlarged image may be acquired. In order to represent all fingerprint information, the images acquired through the adjacent pinholes may overlap each other to a great extent. At this time, a part of the fingerprint information may be lost, and it is impossible to achieve the fingerprint identification function.

As shown in FIG. 1, in order to achieve the fingerprint identification on the basis of the pinhole imaging principle, a display device includes a cover plate 1, an OLED display substrate, and a photosensitive sensor 10 arranged at a backlight side of the OLED display substrate. A color filter layer 2 is arranged between the cover plate 1 and the OLED display substrate and includes a plurality of light-shielding regions (black matrices) arranged between adjacent color resistance layers. A plurality of imaging pinholes 100 is formed in each light-shielding region, and each imaging pinhole 100 is configured to image a fingerprint in contact with the cover plate 1 onto the photosensitive sensor 10. A touch screen layer 3 is arranged between the color filter layer 2 and the OLED display substrate. The OLED display substrate includes a polyimide (PI) flexible substrate 7, and a thin film transistor (TFT) array layer 6 and a light-emitting layer 5 are arranged sequentially on the flexible substrate 7 in a direction toward the cover plate 1. A plurality of light-emitting elements is arranged in an array form on the light-emitting layer 5, and each light-emitting element includes a plurality of pixels. A pixel definition layer (PDL) is arranged between two adjacent pixels, and an orthogonal projection of the imaging pinhole 10 onto the OLED display substrate is located on the pixel definition layer. The OLED display substrate further includes a bottom film 9 arranged at a back surface of the flexible substrate and the photosensitive sensor 10 arranged at a side of the bottom film 9 away from the flexible substrate. An air layer 11 is arranged between the photosensitive sensor 10 and the bottom film 9, so that the photosensitive sensor 10 receives light beams within a predetermined angle range in all light beams passing through the imaging pinhole 100 to acquire a fingerprint image.

Figure 2:
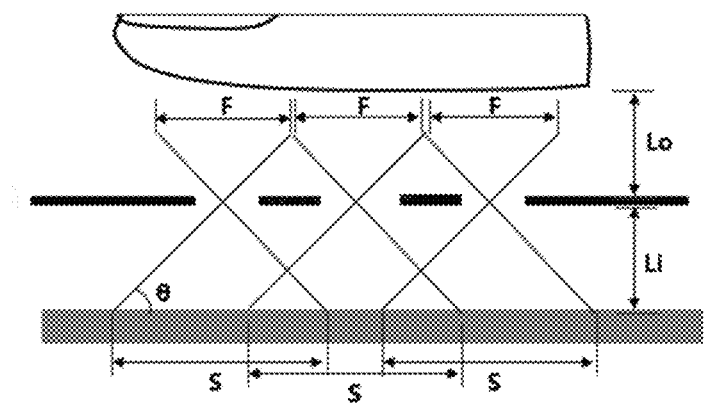
FIG. 2 is a schematic view showing a pinhole imaging principle.

One protection layer (a first protection layer 4) is arranged between the touch screen panel 3 and the light-emitting layer 5, and another protection layer (a second protection layer 8) is arranged between the flexible substrate 7 and the bottom film 9. In order to meet the requirements on the light and thin screen, the cover plate is a flexible cover film rather than a glass substrate. A thickness of the cover film needs to be as small as possible on the premise that the protection function is achieved. The cover film mainly includes an Optical Clear Adhesive (OCA) and a Colorless Polyimide (CPI) base substrate. The OCA has a thickness of 30 μm to 70 μm, the CPI substrate has a thickness of 60 μm to 100 μm, the touch screen panel (TSP) is of a film multi-layer on cell touch (FMLOC) structure and has a thickness of 3 μm to 7 μm, another protection layer (thin-film encapsulation, TFE) between the touch screen panel and the light-emitting layer has a thickness of 6 μm to 14 μm, the TFT array layer has a thickness of 4 μm to 8 μm, the PI substrate has a thickness of 10 μm to 30 μm, the protection layer between the flexible substrate and the bottom film (a pressure sensitive adhesive (PSA) layer) has a thickness of 10 μm to 20 μm, the bottom film (BF) has a thickness of 60 μm to 100 μm, the air layer has a thickness of 10 μm to 30 μm, and the photosensitive sensor has a thickness of 50 μm to 150 μm. FIG. 2 shows a principle of optics for the fingerprint identification of a color filter on encapsulation (COE) structure, where Lo represents the object distance, Li represents the image distance, F represents a size of a finger region identified through each imaging pinhole, and S represents a size of an image acquired on the photosensitive sensor through each imaging pinhole. As shown in FIG. 2, fingerprint images acquired through two adjacent imaging pinholes overlap each other.

When the thickness of the cover plate decreases, a distance between a fingerprint touch interface and the imaging pinhole, i.e., the object distance, may decrease too. When the object distance is smaller than the image distance, a ratio of the object distance to the image distance may be totally different from that in a conventional pinhole fingerprint identification scheme (in a conventional imaging pinhole structure, the object distance is greater than the image distance). At this time, an enlarged image may be acquired, the fingerprint images acquired through the adjacent imaging pinholes may overlap each other to a great extent, and a part of the fingerprint information may be lost, so it is impossible to achieve the fingerprint identification function.

Figure 5:
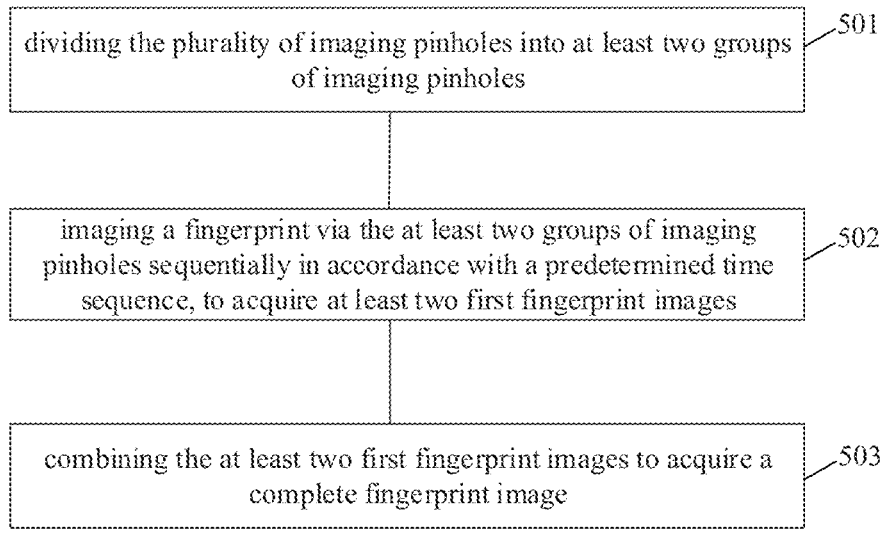
FIG. 5 is a flow chart of a fingerprint identification method according to one embodiment of the present disclosure.

In order to solve the above problems, the present disclosure provides in some embodiments a fingerprint identification method for a display device. As shown in FIG. 1, the display device includes a cover plate 1, an OLED display substrate, and a photosensitive sensor 10 arranged at a side of the OLED display substrate away from the cover plate 1. A color filter layer 2 is arranged between the cover plate 1 and the OLED display substrate and includes a light-shielding region. A plurality of imaging pinholes 100 is formed in the light-shielding region, and each imaging pinhole 100 is configured to image a fingerprint in contact with the cover plate 1 onto the photosensitive sensor 10. The OLED display substrate includes a plurality of light-emitting elements arranged in an array form, and a first distance between the cover plate 1 and the imaging pinhole 100 is smaller than a second distance between the photosensitive sensor 10 and the imaging pinhole 100. As shown in FIG. 5, the fingerprint identification method includes: step 501 of dividing the plurality of imaging pinholes into at least two groups of imaging pinholes, imaging regions on the photosensitive sensor corresponding to any two imaging pinholes in each group being located at different regions on a same plane; step 502 of imaging the fingerprint via the at least two groups of imaging pinholes sequentially in accordance with a predetermined time sequence, to acquire at least two first fingerprint images; and step 503 of combining the at least two first fingerprint images to acquire a complete fingerprint image.

Figure 3:
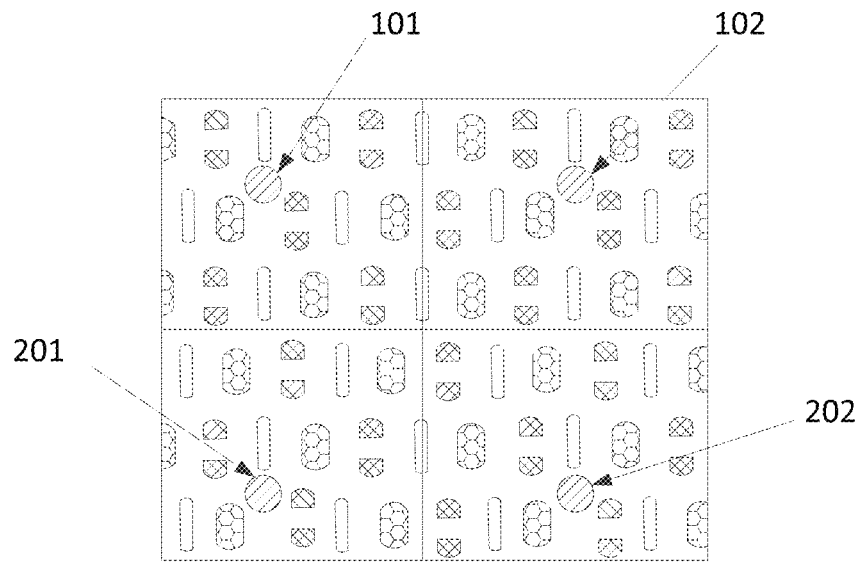
FIG. 3 is a schematic view showing the distribution of a part of imaging pinholes according to one embodiment of the present disclosure.
Figure 4:
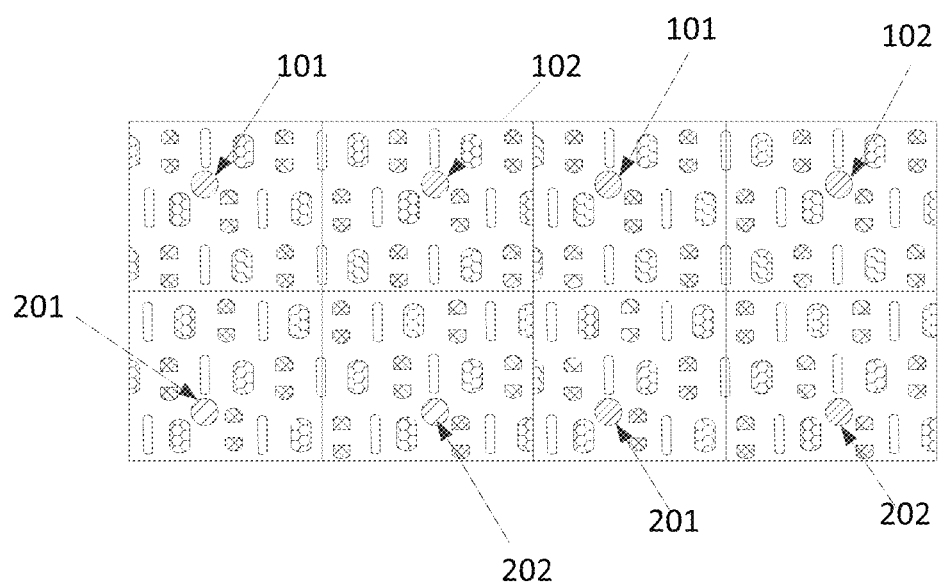
FIG. 4 is another schematic view showing the distribution of a part of imaging pinholes according to one embodiment of the present disclosure.

In the embodiments of the present disclosure, the plurality of imaging pinholes may be arranged in an array form. FIG. 3 shows four imaging pinholes arranged in two rows and two columns, and FIG. 4 shows the imaging pinholes arranged in two rows and four columns. The plurality of imaging pinholes may be divided into groups, and fingerprint may be imaged via the at least two groups of imaging pinholes sequentially in accordance with the predetermined time sequence. The imaging regions corresponding to any two imaging pinholes in each group may be located at different regions, i.e., the imaging regions corresponding to any two imaging pinholes in each group may not overlap each other, so as to prevent, when collecting information, the occurrence of information loss due to a too large overlapping region between the fingerprint images simultaneously acquired via the adjacent imaging pinholes. The images of the fingerprint may be acquired in a time-division and region-division manner, and then the plurality of first fingerprint images acquired via the plurality of groups of imaging pinholes may be combined to acquire the complete fingerprint image.

In the embodiments of the present disclosure, for example, the second distance may be smaller than or equal to 1.414 times of the first distance. At this time, the imaging regions on the photosensitive sensor corresponding to the two adjacent imaging pinholes in a diagonal direction may not overlap each other, and based on this, the plurality of imaging pinholes may be divided into groups.

In the embodiments of the present disclosure, for example, the dividing the plurality of imaging pinholes into the at least two groups of imaging pinholes may include dividing the plurality of imaging pinholes into a first group of imaging pinholes and a second group of imaging pinholes. The first group of imaging pinholes may include a plurality of imaging pinholes in odd-numbered rows and odd-numbered columns and a plurality of imaging pinholes in even-numbered rows and even-numbered columns, and the second group of imaging pinholes may include a plurality of imaging pinholes in the odd-numbered rows and the even-numbered columns and a plurality of imaging pinholes in the even-numbered rows and the odd-numbered columns.

As shown in FIGS. 3 and 4, the first group of imaging pinholes include a first imaging pinhole 101 and a fourth imaging pinhole 202, and the second group of imaging pinholes include a second imaging pinhole 102 and a third imaging pinhole 201.

The light-emitting element on the OLED display substrate may emit light, and the light may be reflected by the fingerprint toward the photosensitive sensor via the imaging pinhole. Based on a pinhole imaging principle, the light emitted by the light-emitting element may pass through a corresponding imaging pinhole, and the fingerprint may be imaged. Hence, in order to image the fingerprint via at least two groups of imaging pinholes in accordance with the predetermined time sequence, the light-emitting elements on the OLED display substrate may be divided into groups, and the groups of light-emitting elements may correspond to the groups of imaging pinholes respectively. Each group of light-emitting elements may include a plurality of light-emitting elements corresponding to the plurality of imaging pinholes in a corresponding group respectively. In this way, through controlling the plurality of groups of light-emitting elements to emit light in accordance with the predetermined time sequence (in a single information collection procedure, merely one group of light-emitting elements may emit light, i.e., the image of the fingerprint may be acquired via merely one group of imaging pinholes), the photosensitive sensor may receive the light via the corresponding groups of imaging pinholes, so as to acquire the complete fingerprint image.

The predetermined time sequence may be set according to the practical need, and several predetermined time sequences will be described hereinafter.

Figure 6:
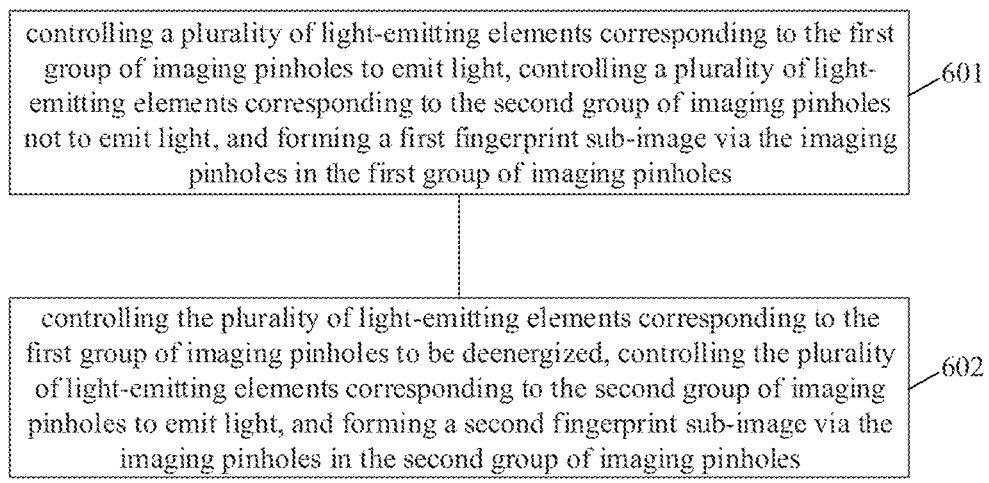
FIG. 6 is another flow chart of the fingerprint identification method according to one embodiment of the present disclosure.

In the embodiments of the present disclosure, for example, as shown in FIG. 6, the imaging the fingerprint via the at least two groups of imaging pinholes sequentially in accordance with the predetermined time sequence to acquire the at least two first fingerprint images may include: step 601 of controlling a plurality of light-emitting elements corresponding to the first group of imaging pinholes to emit light (the other light-emitting elements maybe in an off state), controlling a plurality of light-emitting elements corresponding to the second group of imaging pinholes not to emit light, and forming a first fingerprint sub-image via the imaging pinholes in the first group of imaging pinholes; and step 602 of controlling the plurality of light-emitting elements corresponding to the first group of imaging pinholes to be deenergized, controlling the plurality of light-emitting elements corresponding to the second group of imaging pinholes to emit light, and forming a second fingerprint sub-image via the imaging pinholes in the second group of imaging pinholes. The combining the at least two first fingerprint images to acquire the complete fingerprint image may include combining the first fingerprint sub-image and the second fingerprint sub-image to acquire the complete fingerprint image.

Figure 7:
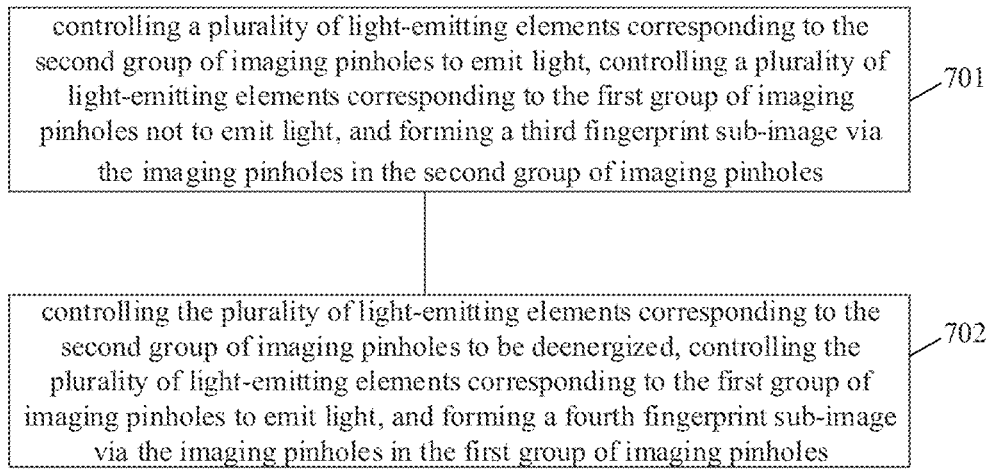
FIG. 7 is still another flow chart of the fingerprint identification method according to one embodiment of the present disclosure.

In the embodiments of the present disclosure, for example, as shown in FIG. 7, the imaging the fingerprint via the at least two groups of imaging pinholes sequentially in accordance with the predetermined time sequence to acquire the at least two first fingerprint images may include: step 701 of controlling the plurality of light-emitting elements corresponding to the second group of imaging pinholes to emit light (the other light-emitting elements may be in the off state), controlling the plurality of light-emitting elements corresponding to the first group of imaging pinholes not to emit light, and forming a third fingerprint sub-image via the imaging pinholes in the second group of imaging pinholes; and step 702 of controlling the plurality of light-emitting elements corresponding to the second group of imaging pinholes to be deenergized, controlling the plurality of light-emitting elements corresponding to the first group of imaging pinholes to emit light, and forming a fourth fingerprint sub-image via the imaging pinholes in the first group of imaging pinholes. The combining the at least two first fingerprint images to acquire the complete fingerprint image may include combining the third fingerprint sub-image and the fourth fingerprint sub-image to acquire the complete fingerprint image.

In the embodiments of the present disclosure, for example, the second distance may be greater than or equal to 1.414 times of the first distance, and smaller than or equal to 2 times of the first distance.

At this time, the fingerprint images acquired via two adjacent imaging pinholes in the diagonal direction may overlap each other, and the imaging regions on the photosensitive sensor corresponding to two adjacent imaging pinholes in a column or row direction may just not overlap each other. Based on this, the plurality of imaging pinholes may be divided into groups.

In the embodiments of the present disclosure, for example, the dividing the plurality of imaging pinholes into the at least two groups of imaging pinholes may include providing each group of imaging pinholes with at least two imaging pinholes spaced apart from each other in the column or row direction.

As shown in FIGS. 3 and 4, in some embodiments of the present disclosure, the plurality of imaging pinholes may be divided into four groups of imaging pinholes. A first group of imaging pinholes may include first imaging pinholes 101 in the odd-numbered rows and the odd-numbered columns, a second group of imaging pinholes may include second imaging pinholes 102 in the odd-numbered rows and the even-numbered columns, a third group of imaging pinholes may include third imaging pinholes 201 in the even-numbered rows and the odd-numbered columns, and a fourth group of imaging pinholes may include fourth imaging pinholes 202 in the even-numbered rows and the even-numbered columns. Each of the four imaging pinholes in FIG. 3 may be considered as a minimum repeating unit.

An imaging order of the first group of imaging pinholes, the second group of imaging pinholes, the third group of imaging pinholes and the fourth group of imaging pinholes may be set according to the practical need. For example, the fingerprint images may be acquired via the first group of imaging pinholes, the second group of imaging pinholes, the third group of imaging pinholes and the fourth group of imaging pinholes sequentially, or via the fourth group of imaging pinholes, the third group of imaging pinholes, the second group of imaging pinholes and the first group of imaging pinholes sequentially.

To be specific, the imaging the fingerprint via the at least two groups of imaging pinholes sequentially in accordance with the predetermined time sequence to acquire the at least two first fingerprint images may include: controlling a plurality of light-emitting elements corresponding to the first group of imaging pinholes to emit light, controlling a plurality of light-emitting elements corresponding to the second group of imaging pinholes, the third group of imaging pinholes and the fourth group of imaging pinholes not to emit light, and forming a first fingerprint sub-image via the first imaging pinholes in the first group of imaging pinholes; controlling the plurality of light-emitting elements corresponding to the first group of imaging pinholes to be deenergized, controlling the plurality of light-emitting elements corresponding to the second group of imaging pinholes to emit light, controlling the plurality of light-emitting elements corresponding to the third group of imaging pinholes and the fourth group of imaging pinholes not to emit light, and forming a second fingerprint sub-image via the second imaging pinholes in the second group of imaging pinholes; controlling the plurality of light-emitting elements corresponding to the second group of imaging pinholes to be deenergized, controlling the plurality of light-emitting elements corresponding to the third group of imaging pinholes to emit light, controlling the plurality of light-emitting elements corresponding to the first group of imaging pinholes and the fourth group of imaging pinholes not to emit light, and forming a third fingerprint sub-image via the third imaging pinholes in the third group of imaging pinholes; and controlling the plurality of light-emitting elements corresponding to the third group of imaging pinholes to be deenergized, controlling the plurality of light-emitting elements corresponding to the fourth group of imaging pinholes to emit light, controlling the plurality of light-emitting elements corresponding to the first group of imaging pinholes and the second group of imaging pinholes not to emit light, and forming a fourth fingerprint sub-image via the fourth imaging pinholes in the fourth group of imaging pinholes. The combining the at least two first fingerprint images to acquire the complete fingerprint image may include combining the first fingerprint sub-image, the second fingerprint sub-image, the third fingerprint sub-image and the fourth fingerprint sub-image to acquire the complete fingerprint image.

Alternatively, the imaging the fingerprint via the at least two groups of imaging pinholes sequentially in accordance with the predetermined time sequence to acquire the at least two first fingerprint images may include: controlling a plurality of light-emitting elements corresponding to the fourth group of imaging pinholes to emit light, controlling a plurality of light-emitting elements corresponding to the first group of imaging pinholes, the second group of imaging pinholes and the third group of imaging pinholes not to emit light, and forming a fourth fingerprint sub-image via the fourth imaging pinholes in the fourth group of imaging pinholes; controlling the plurality of light-emitting elements corresponding to the fourth group of imaging pinholes to be deenergized, controlling the plurality of light-emitting elements corresponding to the third group of imaging pinholes to emit light, controlling the plurality of light-emitting elements corresponding to the first group of imaging pinholes and the second group of imaging pinholes not to emit light, and forming a third fingerprint sub-image via the third imaging pinholes in the third group of imaging pinholes; controlling the plurality of light-emitting elements corresponding to the third group of imaging pinholes to be deenergized, controlling the plurality of light-emitting elements corresponding to the second group of imaging pinholes to emit light, controlling the plurality of light-emitting elements corresponding to the first group of imaging pinholes and the fourth group of imaging pinholes not to emit light, and forming a second fingerprint sub-image via the second imaging pinholes in the second group of imaging pinholes; and controlling the plurality of light-emitting elements corresponding to the second group of imaging pinholes to be deenergized, controlling the plurality of light-emitting elements corresponding to the first group of imaging pinholes to emit light, controlling the plurality of light-emitting elements corresponding to the third group of imaging pinholes and the fourth group of imaging pinholes not to emit light, and forming a first fingerprint sub-image via the first imaging pinholes in the first group of imaging pinholes. The combining the at least two first fingerprint images to acquire the complete fingerprint image may include combining the fourth fingerprint sub-image, the third fingerprint sub-image, the second fingerprint sub-image and the first fingerprint sub-image to acquire the complete fingerprint image.

In the embodiments of the present disclosure, for example, the plurality of light-emitting elements may correspond to the plurality of imaging pinholes respectively, an orthogonal projection of each imaging pinhole onto the OLED display substrate may be located at a first region of the OLED display substrate, and each light-emitting element may include a plurality of pixels located within a predetermined range surrounding the first region.

In the embodiments of the present disclosure, for example, the predetermined range may be a range where M*N pixels enclosing the corresponding imaging pinholes are arranged, where M and N are each an integer greater than or equal to 2.

The present disclosure further provides in some embodiments a fingerprint identification structure, which includes: a base substrate, and a plurality of imaging pinholes formed in the base substrate and divided into at least two groups of imaging pinholes; an OLED display substrate including a plurality of light-emitting elements arranged in an array form and a driving circuitry configured to drive the plurality of light-emitting elements to emit light; a photosensitive sensor arranged at a side of the OLED display substrate away from the base substrate, the driving circuitry being configured to control the plurality of light-emitting elements corresponding to the at least two groups of imaging pinholes to emit light in accordance with a predetermined time sequence, so that a fingerprint is imaged via the at least two groups of imaging pinholes onto the photosensitive sensor in accordance with the predetermined time sequence to acquire at least two first fingerprint images, imaging regions on the photosensitive sensor corresponding to any two imaging pinholes in each group being located at different regions on a same plane; and an image processing circuitry coupled to the photosensitive sensor and configured to combine the at least two first fingerprint images to acquire a complete fingerprint image. A first distance between the base substrate and each imaging pinhole is smaller than a second distance between the photosensitive sensor and the imaging pinhole.

The present disclosure further provides in some embodiments a display device including the above-mentioned fingerprint identification structure. The base substrate is also used as a cover plate, a color filter layer is arranged between the cover plate and the OLED display substrate and includes a light-shielding layer arranged between adjacent color resistance layers, the plurality of imaging pinholes is formed in the light-shielding region, and the imaging pinhole is configured to image a fingerprint in contact with the cover plate onto the photosensitive sensor.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A fingerprint identification method for a display device, wherein the display device comprises a cover plate, an Organic Light-Emitting Diode (OLED) display substrate, and a photosensitive sensor arranged at a side of the OLED display substrate away from the cover plate, a color filter layer is arranged between the cover plate and the OLED display substrate and comprises a light-shielding region arranged between adjacent color resistance layers, a plurality of imaging pinholes is formed in the light-shielding region, each imaging pinhole is configured to image a fingerprint in contact with the cover plate onto the photosensitive sensor, the OLED display substrate comprises a plurality of light-emitting elements arranged in an array form, and a first distance between the cover plate and the imaging pinhole is smaller than a second distance between the photosensitive sensor and the imaging pinhole, wherein the fingerprint identification method comprises:
dividing the plurality of imaging pinholes into at least two groups of imaging pinholes, imaging regions on the photosensitive sensor corresponding to any two imaging pinholes in each group being located at different regions on a same plane;
imaging the fingerprint via the at least two groups of imaging pinholes sequentially in accordance with a predetermined time sequence, to acquire at least two first fingerprint images; and
combining the at least two first fingerprint images to acquire a complete fingerprint image;
wherein the plurality of imaging pinholes is arranged in an array form;
wherein the second distance is smaller than or equal to 1.414 times of the first distance;
wherein the dividing the plurality of imaging pinholes into the at least two groups of imaging pinholes comprises dividing the plurality of imaging pinholes into a first group of imaging pinholes and a second group of imaging pinholes, wherein the first group of imaging pinholes comprise a plurality of imaging pinholes in odd-numbered rows and odd-numbered columns and a plurality of imaging pinholes in even-numbered rows and even-numbered columns, and the second group of imaging pinholes comprise a plurality of imaging pinholes in the odd-numbered rows and the even-numbered columns and a plurality of imaging pinholes in the even-numbered rows and the odd-numbered columns.

2. The fingerprint identification method according to claim 1, wherein the imaging the fingerprint via the at least two groups of imaging pinholes sequentially in accordance with the predetermined time sequence to acquire the at least two first fingerprint images comprises:
controlling a plurality of light-emitting elements corresponding to the first group of imaging pinholes to emit light, controlling a plurality of light-emitting elements corresponding to the second group of imaging pinholes not to emit light, and forming a first fingerprint sub-image via the imaging pinholes in the first group of imaging pinholes; and
controlling the plurality of light-emitting elements corresponding to the first group of imaging pinholes to be deenergized, controlling the plurality of light-emitting elements corresponding to the second group of imaging pinholes to emit light, and forming a second fingerprint sub-image via the imaging pinholes in the second group of imaging pinholes,
wherein the combining the at least two first fingerprint images to acquire the complete fingerprint image comprises combining the first fingerprint sub-image and the second fingerprint sub-image to acquire the complete fingerprint image.

3. The fingerprint identification method according to claim 1, wherein the imaging the fingerprint via the at least two groups of imaging pinholes sequentially in accordance with the predetermined time sequence to acquire the at least two first fingerprint images comprises:
controlling a plurality of light-emitting elements corresponding to the second group of imaging pinholes to emit light, controlling a plurality of light-emitting elements corresponding to the first group of imaging pinholes not to emit light, and forming a third fingerprint sub-image via the imaging pinholes in the second group of imaging pinholes; and
controlling the plurality of light-emitting elements corresponding to the second group of imaging pinholes to be deenergized, controlling the plurality of light-emitting elements corresponding to the first group of imaging pinholes to emit light, and forming a fourth fingerprint sub-image via the imaging pinholes in the first group of imaging pinholes,
wherein the combining the at least two first fingerprint images to acquire the complete fingerprint image comprises combining the third fingerprint sub-image and the fourth fingerprint sub-image to acquire the complete fingerprint image.

4. The fingerprint identification method according to claim 1, wherein the plurality of light-emitting elements corresponds to the plurality of imaging pinholes respectively, an orthogonal projection of each imaging pinhole onto the OLED display substrate is located at a first region of the OLED display substrate, and each light-emitting element comprises a plurality of pixels located within a predetermined range surrounding the first region.

5. The fingerprint identification method according to claim 4, wherein the predetermined range is a range where M*N pixels enclosing the corresponding imaging pinhole are arranged, where M and N are each an integer greater than or equal to 2.

6. A fingerprint identification method for a display device, wherein the display device comprises a cover plate, an Organic Light-Emitting Diode (OLED) display substrate, and a photosensitive sensor arranged at a side of the OLED display substrate away from the cover plate, a color filter layer is arranged between the cover plate and the OLED display substrate and comprises a light-shielding region arranged between adjacent color resistance layers, a plurality of imaging pinholes is formed in the light-shielding region, each imaging pinhole is configured to image a fingerprint in contact with the cover plate onto the photosensitive sensor, the OLED display substrate comprises a plurality of light-emitting elements arranged in an array form, and a first distance between the cover plate and the imaging pinhole is smaller than a second distance between the photosensitive sensor and the imaging pinhole,
wherein the fingerprint identification method comprises:
dividing the plurality of imaging pinholes into at least two groups of imaging pinholes, imaging regions on the photosensitive sensor corresponding to any two imaging pinholes in each group being located at different regions on a same plane;
imaging the fingerprint via the at least two groups of imaging pinholes sequentially in accordance with a predetermined time sequence, to acquire at least two first fingerprint images; and
combining the at least two first fingerprint images to acquire a complete fingerprint image;
wherein the second distance is greater than or equal to 1.414 times of the first distance, and smaller than or equal to 2 times of the first distance;
wherein the dividing the plurality of imaging pinholes into the at least two groups of imaging pinholes comprises providing each group of imaging pinholes with at least two imaging pinholes spaced apart from each other;
wherein the providing each group of imaging pinholes with the at least two imaging pinholes spaced apart from each other comprises dividing the plurality of imaging pinholes into a first group of imaging pinholes, a second group of imaging pinholes, a third group of imaging pinholes and a fourth group of imaging pinholes, wherein the first group of imaging pinholes comprise first imaging pinholes in odd-numbered rows and odd-numbered columns, the second group of imaging pinholes comprise second imaging pinholes in the odd-numbered rows and even-numbered columns, the third group of imaging pinholes comprise third imaging pinholes in even-numbered rows and the odd-numbered columns, and the fourth group of imaging pinholes comprise fourth imaging pinholes in the even-numbered rows and the even-numbered columns.

7. The fingerprint identification method according to claim 6, wherein the imaging the fingerprint via the at least two groups of imaging pinholes sequentially in accordance with the predetermined time sequence to acquire the at least two first fingerprint images comprises:
controlling a plurality of light-emitting elements corresponding to the first group of imaging pinholes to emit light, controlling a plurality of light-emitting elements corresponding to the second group of imaging pinholes, the third group of imaging pinholes and the fourth group of imaging pinholes not to emit light, and forming a first fingerprint sub-image via the first imaging pinholes in the first group of imaging pinholes;
controlling the plurality of light-emitting elements corresponding to the first group of imaging pinholes to be deenergized, controlling the plurality of light-emitting elements corresponding to the second group of imaging pinholes to emit light, controlling the plurality of light-emitting elements corresponding to the third group of imaging pinholes and the fourth group of imaging pinholes not to emit light, and forming a second fingerprint sub-image via the second imaging pinholes in the second group of imaging pinholes;
controlling the plurality of light-emitting elements corresponding to the second group of imaging pinholes to be deenergized, controlling the plurality of light-emitting elements corresponding to the third group of imaging pinholes to emit light, controlling the plurality of light-emitting elements corresponding to the first group of imaging pinholes and the fourth group of imaging pinholes not to emit light, and forming a third fingerprint sub-image via the third imaging pinholes in the third group of imaging pinholes; and
controlling the plurality of light-emitting elements corresponding to the third group of imaging pinholes to be deenergized, controlling the plurality of light-emitting elements corresponding to the fourth group of imaging pinholes to emit light, controlling the plurality of light-emitting elements corresponding to the first group of imaging pinholes and the second group of imaging pinholes not to emit light, and forming a fourth fingerprint sub-image via the fourth imaging pinholes in the fourth group of imaging pinholes,
wherein the combining the at least two first fingerprint images to acquire the complete fingerprint image comprises combining the first fingerprint sub-image, the second fingerprint sub-image, the third fingerprint sub-image and the fourth fingerprint sub-image to acquire the complete fingerprint image.

8. The fingerprint identification method according to claim 6, wherein the imaging the fingerprint via the at least two groups of imaging pinholes sequentially in accordance with the predetermined time sequence to acquire the at least two first fingerprint images comprises:
controlling a plurality of light-emitting elements corresponding to the fourth group of imaging pinholes to emit light, controlling a plurality of light-emitting elements corresponding to the first group of imaging pinholes, the second group of imaging pinholes and the third group of imaging pinholes not to emit light, and forming a fourth fingerprint sub-image via the fourth imaging pinholes in the fourth group of imaging pinholes;
controlling the plurality of light-emitting elements corresponding to the fourth group of imaging pinholes to be deenergized, controlling the plurality of light-emitting elements corresponding to the third group of imaging pinholes to emit light, controlling the plurality of light-emitting elements corresponding to the first group of imaging pinholes and the second group of imaging pinholes not to emit light, and forming a third fingerprint sub-image via the third imaging pinholes in the third group of imaging pinholes;
controlling the plurality of light-emitting elements corresponding to the third group of imaging pinholes to be deenergized, controlling the plurality of light-emitting elements corresponding to the second group of imaging pinholes to emit light, controlling the plurality of light-emitting elements corresponding to the first group of imaging pinholes and the fourth group of imaging pinholes not to emit light, and forming a second fingerprint sub-image via the second imaging pinholes in the second group of imaging pinholes; and
controlling the plurality of light-emitting elements corresponding to the second group of imaging pinholes to be deenergized, controlling the plurality of light-emitting elements corresponding to the first group of imaging pinholes to emit light, controlling the plurality of light-emitting elements corresponding to the third group of imaging pinholes and the fourth group of imaging pinholes not to emit light, and forming a first fingerprint sub-image via the first imaging pinholes in the first group of imaging pinholes,
wherein the combining the at least two first fingerprint images to acquire the complete fingerprint image comprises combining the fourth fingerprint sub-image, the third fingerprint sub-image, the second fingerprint sub-image and the first fingerprint sub-image to acquire the complete fingerprint image.

9. The fingerprint identification method according to claim 6, wherein the plurality of light-emitting elements corresponds to the plurality of imaging pinholes respectively, an orthogonal projection of each imaging pinhole onto the OLED display substrate is located at a first region of the OLED display substrate, and each light-emitting element comprises a plurality of pixels located within a predetermined range surrounding the first region.

10. The fingerprint identification method according to claim 9, wherein the predetermined range is a range where M*N pixels enclosing the corresponding imaging pinhole are arranged, where M and N are each an integer greater than or equal to 2.

11. A fingerprint identification structure, comprising:
a base substrate, and a plurality of imaging pinholes formed in the base substrate and divided into at least two groups of imaging pinholes;
an OLED display substrate comprising a plurality of light-emitting elements arranged in an array form and a driving circuitry configured to drive the plurality of light-emitting elements to emit light;
a photosensitive sensor arranged at a side of the OLED display substrate away from the base substrate, the driving circuitry being configured to control the plurality of light-emitting elements corresponding to the at least two groups of imaging pinholes to emit light in accordance with a predetermined time sequence, so that a fingerprint is imaged via the at least two groups of imaging pinholes onto the photosensitive sensor in accordance with the predetermined time sequence to acquire at least two first fingerprint images, imaging regions on the photosensitive sensor corresponding to any two imaging pinholes in each group being located at different regions on a same plane; and
an image processing circuitry coupled to the photosensitive sensor and configured to combine the at least two first fingerprint images to acquire a complete fingerprint image,
wherein a first distance between the base substrate and each imaging pinhole is smaller than a second distance between the photosensitive sensor and the imaging pinholes;
wherein the plurality of imaging pinholes is arranged in an array form;
wherein the second distance is smaller than or equal to 1.414 times of the first distance;
wherein the dividing the plurality of imaging pinholes into the at least two groups of imaging pinholes comprises dividing the plurality of imaging pinholes into a first group of imaging pinholes and a second group of imaging pinholes, wherein the first group of imaging pinholes comprise a plurality of imaging pinholes in odd-numbered rows and odd-numbered columns and a plurality of imaging pinholes in even-numbered rows and even-numbered columns, and the second group of imaging pinholes comprise a plurality of imaging pinholes in the odd-numbered rows and the even-numbered columns and a plurality of imaging pinholes in the even-numbered rows and the odd-numbered columns.

12. A display device, comprising the fingerprint identification structure according to claim 11, wherein the base substrate is also used as a cover plate, a color filter layer is arranged between the cover plate and the OLED display substrate and comprises a light-shielding layer arranged between adjacent color resistance layers, the plurality of imaging pinholes is formed in the light-shielding region, and the imaging pinhole is configured to image a fingerprint in contact with the cover plate onto the photosensitive sensor.

13. The fingerprint identification structure according to claim 11, wherein the driving circuitry is further configured to:
    control a plurality of light-emitting elements corresponding to the first group of imaging pinholes to emit light, controlling a plurality of light-emitting elements corresponding to the second group of imaging pinholes not to emit light, and form a first fingerprint sub-image via the imaging pinholes in the first group of imaging pinholes; and
    control the plurality of light-emitting elements corresponding to the first group of imaging pinholes to be deenergized, controlling the plurality of light-emitting elements corresponding to the second group of imaging pinholes to emit light, and form a second fingerprint sub-image via the imaging pinholes in the second group of imaging pinholes;
    wherein the image processing circuitry is further configured to combine the first fingerprint sub-image and the second fingerprint sub-image to acquire the complete fingerprint image.

14. The fingerprint identification structure according to claim 11, wherein the driving circuitry is further configured to:
    control a plurality of light-emitting elements corresponding to the second group of imaging pinholes to emit light, controlling a plurality of light-emitting elements corresponding to the first group of imaging pinholes not to emit light, and forming a third fingerprint sub-image via the imaging pinholes in the second group of imaging pinholes; and
    control the plurality of light-emitting elements corresponding to the second group of imaging pinholes to be deenergized, controlling the plurality of light-emitting elements corresponding to the first group of imaging pinholes to emit light, and forming a fourth fingerprint sub-image via the imaging pinholes in the first group of imaging pinholes,
    wherein the image processing circuitry is further configured to combine the third fingerprint sub-image and the fourth fingerprint sub-image to acquire the complete fingerprint image.

* * * * *